United States Patent [19]
Tou et al.

[11] Patent Number: 5,196,103
[45] Date of Patent: Mar. 23, 1993

[54] METHOD OF MAKING AN ELECTRICAL INTERCONNECTION DEVICE

[75] Inventors: James C. Tou; Paul H. Townsend, III, both of Midland, Mich.

[73] Assignee: The Dow Chemical Company, Midland, Mich.

[21] Appl. No.: 729,525

[22] Filed: Jul. 12, 1991

[51] Int. Cl.$^5$ .................... B29B 13/00; B29B 13/08
[52] U.S. Cl. .................... 204/192.34; 204/192.36; 427/404; 427/255.7
[58] Field of Search .................... 204/192.34, 192.36; 156/643; 427/307, 322, 404, 255.7

[56] References Cited

U.S. PATENT DOCUMENTS 4,886,681 12/1989 Clabes et al. .................... 427/38
4,902,647  2/1990 Chutjian et al. .................... 437/239

OTHER PUBLICATIONS

Bodö et al., "Adhesion of Evaporated Titanium to Polyethylene: Effects of Ion Bombardment Pretreatment", *J. of Vac. Sci. Technol.*, A2 (4), pp. 1498-1502 (1984).

Bodö et al., "Adhesion of Evaporated Titanium Films to Ion-Bombarded Polyethylene", *J. Appl. Phys.*, 60 (3), pp. 1161-1168 (1986).

Bodoö et al., "The Adhesion of Evaporated Metal Films to Polyethylene Substrates", *Surface and Interface Analysis*, vol. 9, pp. 437-440 (1986).

Townsend et al., "Multilayer Interconnection Structures Using Second Generation Polymers Derived from Bisbenzocyclobutane", *ISHM Proceedings*, 1989.

Paik et al., "Interfacial Studies on Cr and Ti deposited on Benzocyclobutane (BCB) Film", *Mat. Res. Soc. Meeting*, Boston, Mass., Nov. 26-30, 1990.

Fong et al., "Polybenzocyclobutene Resins in Multilayer thin Films for Electronic Packaging", 22nd Int. *SAMPE Tech. Conf.* (1990).

Primary Examiner—Aaron Weisstuch

[57] ABSTRACT

The present invention refers to an electrical interconnection device having conductive metal layers separated by a dielectric cyclobutarene polymer layer. The adhesion of the conductive metal layer to the dielectric cyclobutarene polymer layer is promoted by a carbide-forming metal interface layer. Further disclosed is a method of making such electrical interconnection device by ion sputtering the dielectric cyclobutarene polymer surface, vapor depositing a carbide-forming metal interface layer onto the sputtered polymer surface, and then vapor depositing the superior conductive metal layer onto the carbide-forming metal interface layer.

16 Claims, No Drawings

METHOD OF MAKING AN ELECTRICAL INTERCONNECTION DEVICE

BACKGROUND OF THE INVENTION

The invention relates to electrical interconnection devices and to methods of making these electrical interconnection devices. More particularly, the invention relates to electrical interconnection devices comprising multiple polymeric and metallic layers which are useful in electronic applications.

The general trend in microelectronic circuits is toward systems of materials which deliver higher performance at a reduced cost. In integrated circuits, the interconnection structure is often the performance limiting and space consuming part of the overall circuit. Recently, multichip modules for interconnecting multiple chips in high density circuits have gained increased interest.

High density, thin film multichip module packaging is one of the more promising techniques among various multichip module packaging approaches because of its fine dimensional capability, use of lower dielectric constant polymers for dielectric interface layers, and ease of processing. The multichips are usually in the form of a multilayered structure, wherein conductive metal layers are separated by an organic dielectric interface layer material. It has been found that certain organic dielectrics offer the potential for achieving higher performance and increased density, and are therefore suitable for use in electronic applications.

The thermomechanical properties of dielectric materials are important for the integrity and reliability of the final circuit. High thermal stability and a reasonably low thermal expansion coefficient are desirable for circuit processing and performance. In multichip modules applications, for example, stability at about 300° C. is considered sufficient for the fabrication process. Silicon-based integrated circuit technologies require somewhat higher processing temperatures, usually exceeding about 400° C. The thermal stability of organic dielectric materials determines the maximum temperature to which the circuit may be exposed during processing and use.

Polyimides have been widely used as the dielectric material despite certain disadvantages. For example, they have a relatively high dielectric constant and high water absorption compared to other polymers. Therefore, for improved reliability and faster signal propagation, polymers with lower water absorption and lower dielectric constant are required. The cyclobutarenes, specifically benzocyclobutanes (BCBs), meet the requirements of lower water absorption and lower dielectric constant and present further advantages. For example, cyclobutarenes have a high degree of planarization and good thermal stability compared to other polymers used in the microelectronic industry. Therefore, cyclobutarenes are currently preferred for microelectronic applications.

The cyclobutarenes in the form of thin films are especially desirable dielectric materials due to their thermal and electrical properties. However, when polymers are formed as thin films on substrates, another critical problem arises: unacceptably low adhesion at the interface between the film and the next adjacent layer, usually a conductive metal layer.

To promote reliable adhesion of a cyclobutarene polymer to an inorganic substrate, one may use an adhesion promoter. In the case of a plastic material, the adhesion promoter may be mixed with the monomer or prepolymer as it is coated on a surface or may be used to coat the surface prior to coating with the cyclobutarene.

Additionally, successive layers of polymer may be efficiently adhered to one another by only partially curing the polymer layers until all layers have been applied. Then by more completely curing the polymer, the contacting layers form chemical bonds between themselves.

Use of adhesion promoters such as those discussed above or partially curing the polymer, does not apply when a conductive metal layer is to be placed over a polymer surface. It is, however, well-known that the adhesion between a polymeric cyclobutarene and metallic material is generally poor.

In view of this deficiency, numerous efforts toward enhancing the adhesion of a metal layer to a polymeric layer have been made. One technique includes depositing an adhesion enhancing metal interface layer (herein also referred to as "tie layer") and then depositing the desired metal layer. Such technique involves pretreating the polymeric surface by backsputtering, either with plasma or reactive ions, usually with high energy density. However, this treatment often disrupts the polymeric layer so severely that diffusion of the tie layer metal into the disrupted polymeric surface may occur, which, in turn, may reduce the performance of the dielectric layer to unacceptable levels. Also, the resulting tie layer often has a thickness between about 200 to about 1000 Angstroms (A), and can decrease the high frequency conductivity of the conductive metal layers.

Therefore, it would be most desirable to provide an electrical interconnection device which has a multilayered structure comprising conductive metal layers separated by a dielectric cyclobutarene polymer layer wherein the conductive metal layers adhere sufficiently to the dielectric layer to withstand processing conditions normally employed in making such devices.

SUMMARY OF THE INVENTION

In one aspect, the present invention is an electrical interconnection device having means to connect electronic circuitries on a supporting substrate, with at least two conductive metal layers each being separated by a dielectric cyclobutarene polymer layer, wherein at least one dielectric cyclobutarene polymer layer is chemically bonded to a conductive metal layer by means of a tie layer comprising a carbide-forming metal interface layer having a thickness between about 5 and about 200Å.

In another aspect, the present invention is a method of adhering a conductive metal layer onto a dielectric cyclobutarene polymer layer, which method comprises a) low energy sputtering the dielectric cyclobutarene polymer surface at an energy density such that the polymer surface is roughened by no more than about 50Å;

b) depositing a carbide-forming metal interface layer having a thickness between about 5 and about 200Å onto the sputtered polymer surface;

c) depositing the conductive metal layer onto the carbide-forming metal interface layer.

Yet in another aspect, the present invention is an improved method of making an electrical interconnection device having means to connect electronic circuitries on a supporting substrate with at least two conductive metal layers separated by a dielectric cyclobutarene polymer layer, wherein the improvement comprises a) low energy sputtering the dielectric cyclobutarene polymer surface at an energy density such that the polymer surface is roughened by no more than about 50Å;

b) depositing a carbide-forming metal interface layer having a thickness between about 5 and about 200Å onto the sputtered polymer surface;

c) depositing the conductive metal layer onto the carbide-forming metal interface layer.

It has been found that the inclusion of a tie layer having a thickness no greater than 200 Å between a metallic layer and cyclobutarene layer enhances the adhesive strength thereof significantly without deleteriously affecting the electroconductivity of the device. Accordingly, the present invention provides a multilayered structure having increased adhesive strength between their layers useful as an electrical interconnection device for electronic applications.

DETAILED DESCRIPTION OF THE INVENTION

The dielectric cyclobutarene polymer used in the present invention is a reaction product of a cyclobutarene monomer represented by the general formula:

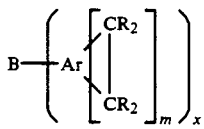

wherein

B is a direct bond or bridging member which comprises (1) a polyvalent inorganic moiety, or (2) a polyvalent organic moiety:

Ar is an aromatic moiety or a substituted aromatic moiety:

R is separately, in each occurrence hydrogen or a monovalent moiety:

m is an integer of 1 or more, most preferably, m is one; and x is an integer of 2 or more, most preferably, x is two: with the proviso that B can only be a direct bond when x is two.

Cyclobutarene polymers useful in the present invention are disclosed in U.S. Pat. No. 4,540,763, which is incorporated herein by reference.

A cyclobutarene moiety is an aromatic moiety to which one or more cyclobutane rings are fused. Aromatic moieties are cyclic structures which contain (4n+2)n electrons as described in Morrison and Boyd, *Organic Chemistry*, pp. 327-28, 3rd ed., 1973. Examples of suitable aromatic moieties include those derived from benzene, napthalene, phenanthrene, anthracene, pyridine, a diaromatic moiety, or 2 or more aromatic moieties bridged by alkylene or cycloalkylene moieties. Preferred aromatic moieties are benzene, napthalene, biphenyl, binaphthyl, diphenyl alkane or diphenyl cycloalkane moieties. The more preferred aromatic moiety is a benzene moiety.

The aromatic moiety can be further substituted with a variety of monovalent moieties. Examples of suitable monovalent moieties include $-NO_2$, $-CN$, Br, I, Cl, F, H, $-OH$, $-PR^4_2$, $-CO_2R^4$, $-CHO$,

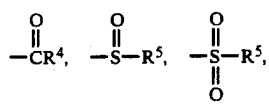

hydrocarbyl, hydrocarbyloxy, hydrocarbylthio, $-OR^4$, $-NHR^4$, and $-NR^4_2$, wherein $R^4$ is hydrogen or alkyl and $R^5$ is alkyl or aryl. Hydrocarbyl refers to any organic moiety containing only carbon and hydrogen atoms. As used, the term hydrocarbyl means a monovalent hydrocarbon moiety including the following: alkyl, alkenyl, alkynyl, cycloalkyl, cycloalkenyl, cycloalkynyl, aryl, aliphatic and cycloaliphatic aralkyl and alkaryl, and similar hydrocarbon moieties having 1-20 carbon atoms. Aliphatic refers herein to straight- and branched-, saturated and unsaturated, hydrocarbon chains, i.e., alkyl, alkenyl or alkynyl. Cycloaliphatic refers herein to saturated and unsaturated cyclic hydrocarbons, that is, cycloalkenyl, cycloalkynyl, and cycloalkyl. Aryl refers herein to biphenyl, phenyl, naphthyl, phenanthrenyl, anthracenyl and two aryl groups bridged by an alkylene group or heteroatoms such as oxygen and sulfur. Alkaryl refers herein to an alkyl-, alkenyl- or alkynyl-substituted aryl substituent wherein aryl is as defined hereinbefore. Alkenearyl refers herein to a radical which contains at least one alkene portion and one aromatic portion, and includes those radicals in which more than one alkene radical alternates with more than one aryl radical. $C_{1-20}$ alkyl includes straight- and branched-chain methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl moieties. $C_{1-10m}$ alkyl includes methyl, ethyl, propyl, butyl, pentyl, hexyl, heptyl, octyl, nonyl, and decyl moieties.

Cycloalkyl refers to alkyl groups containing one or more cycloaliphatic rings. Cycloalkenyl refers to mono- and polycyclic aliphatic groups containing one or more double bonds.

Polyvalent inorganic moieties, as used herein, include any inorganic moiety which is capable of bonding to 2 or more aryl moieties. Such polyvalent inorganic moieties can be covalently or ionically bonded t the aromatic moiety. Examples of polyvalent inorganic moieties include oxygen, phosphorus, phosphorus oxide, sulfur, nitrogen, polysiloxanes, polyvalent metals, sulfoxide, sulfone, a polyvalent metal bound to a polyvalent oxygenated moiety wherein the polyvalent oxygenated moiety can be further bound to an aryl moiety (for example a polyvalent carboxylate salt). Preferred polyvalent inorganic moieties include oxygen, sulfur, polysiloxanes, and polyvalent metals bound to polyvalent oxygenated moieties.

Polyvalent organic moieties, as used herein, include any organic moiety which can link 2 or more aryl moieties. Examples of polyvalent organic moieties include divalent organic moieties, such as hydrocarbylene, dicarbonyloxy hydrocarbylene, dicarboxamido hydrocarbylene, dicarbonyldioxy hydrocarbylene, dioxyhydrocarbylene, and dithiohydrocarbylene moieties.

A preferred cyclobutarene monomer includes a molecule which contains at least one, and preferably two or more cyclobutarene moieties which, under ring opening conditions, can provide addition polymerization sites. Monomers containing one cyclobutarene moiety are referred to as mono-cyclobutarene monomers. Monomers containing two or more cyclobutarene moieties are referred to as poly(cyclobutarene) monomers.

Exemplary cyclobutarenes include those of the formulae

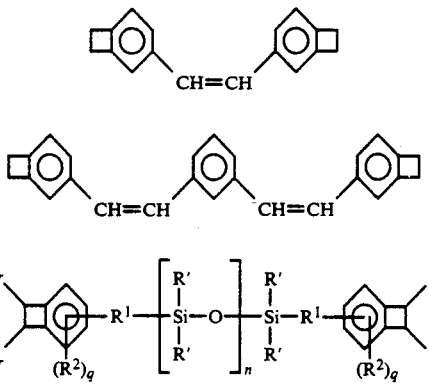

wherein each R' is independently hydrogen, $C_{1-6}$ alkyl, cycloalkyl, aralkyl, or phenyl: each $R^1$ is independently ethenylene, propenylene, or isopropenylene; each $R^2$ is independently $C_{1-6}$ alkyl, methoxy, or chloro: each $R^3$ is independently $C_{1-6}$ alkyl, chloro, or cyano: n is an integer of 1 or more: and each q and r is independently an integer of zero or 1.

Examples of specific monomers that can be polymerized to form effective dielectric films are represented by the formulae

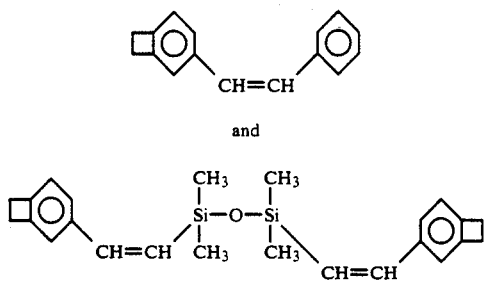

Methods for making the cyclobutarenes useful in the present invention are set out in U.S. Pat. Nos. 4,540,763: 4,562,280: 4,570,011: 4,642,329; 4,724,260; 4,783,514: 4,812,588; 4,822,930: 4,826,997: 4,831,172: 4,851,603 and 4,864,010: all of which are incorporated herein by reference.

The most preferred monomers for use in the present invention are tetraalkyl divinyl disiloxane bisbenzocyclobutane monomers with tetramethyl divinyl disiloxane bisbenzocyclobutane monomer, which is represented by the above formula VI, being especially preferred.

Tetralkyl divinyl disiloxane bisbenzocyclobutane monomers can be prepared by reacting an excess of a halobenzocyclobutane, preferably bromobenzocyclobutane, with the desired organo-polysiloxane bridging group. Typically, a molar ratio of the bromobenzocyclobutane to the organopolysiloxane bridging group of at least 1.5:1 is desired, preferably at least 2:1. Preferably, the bromobenzocyclobutane is a 4-bromobenzocyclobutane represented by the formula:

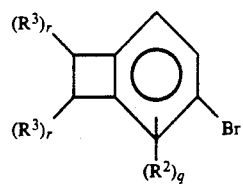

wherein $R^2$ is $C_{1-6}$ alkyl, methoxy, or chloro: $R^3$ is $C_{1-6}$ alkyl, chloro, or cyano; and each q and r is independently an integer of zero or 1.

The desired organopolysiloxane bridging group is represented by the formula:

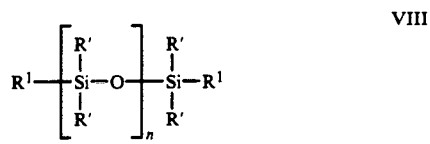

wherein each R' is independently hydrogen, $C_{1-6}$ alkyl, cycloalkyl, aralkyl, or phenyl, preferably methyl: each $R^1$ is independently vinyl ($-CH=CH_2$), allyl ($-CH=CH-CH_3$), or methallyl

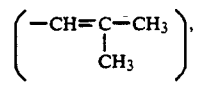

most preferably vinyl; and n is an integer of 1 or more.

The reaction is possible because the organopolysiloxane bridging group is a bisvinyl or bisallyl bridging group. The substitution reaction of an olefinic compound possessing at least one hydrogen on a vinylic position with an organic halide is known and disclosed in U.S. Pat. No. 3,922,299 (Heck).

Organopolysiloxanes and processes for preparing them are known and disclosed in U.S. Pat. Nos. 3,584,027: 3,701,195: 3,770,768: and 3,803,196. A process for preparing bromobenzocyclobutane is disclosed by Lloyd et al., Tetrahedron. Vol. 21, pp. 245-254 (1965) at page 253.

The cyclobutarene polymers are the preferred dielectric material for use in the present invention due to their excellent physical properties, such as, for example a dielectric constant of less than 3 and low moisture absorptivity of 0.24 percent, high temperature stability of 300° C. and excellent planarization of greater than 90 percent.

The cyclobutarene polymers are used as the dielectric layer(s) in the electrical interconnection device of the present invention. The dielectric layer(s) in turn separates two conductive metal layers. The multilayered structure is deposited on a supporting substrate.

In a preferred embodiment, the electrical interconnection device of the present invention has a multilayered structure comprising more than two conductive metal layers and hence more than one dielectric cyclobutarene polymer layer.

The carbide-forming metals useful in the present invention include any metal which can react with an organic material having aliphatic hydrogens, after these hydrogens having been sputtered, to form a metal carbide. These metals typically include the transition metals. Preferred transition metals are those included in Groups IV-B, V-B, VI-B and VIII of the Periodic Table of the Elements (CAS version, *Condensed Chemical Dictionary*, Eleventh edition, 1987), most preferably titanium, chromium, nickel, tungsten or alloys thereof, with titanium being especially preferred.

It is found that the carbide-forming metal after being deposited on the cyclobutarene surface, will be in the form of the pure metal, its carbide, its oxides or mixtures thereof.

The conductive metal useful in the present invention includes any conductive metal commonly employed in electrical/electronic applications, such as, for example, copper, aluminum, silver, gold, magnesium, or platinum. For economic reasons, the most preferred conductive metal employed herein is copper.

In the third aspect, the present invention is a method of making the electrical interconnection device having at least two conductive metal layers separated by a dielectric cyclobutarene polymer layer, wherein the chemical bonding of at least one conductive metal layer to the dielectric cyclobutarene polymer layer is promoted by means of low energy sputtering with a carbide-forming metal.

In addition to specific electrical properties, the supporting substrate, to which the multilayered structure of the present invention is adhered, has to meet numerous requirements with respect to the physical and mechanical properties. The supporting substrate should present a flat and highly polished surface to build upon. It should further be inert to process chemicals, gas atmospheres and temperatures used during the fabrication of an electrical interconnection device.

Exemplary supporting substrates which are useful in the present invention include, for example, silicon wafers, metals, and ceramics. For purposes of this invention, silicon wafer substrates are preferred. Further, for the purposes of this invention, the first layer on the supporting substrate is not critical, i.e., it may be a polymeric cyclobutarene or conductive metal layer.

The coating of a polymeric cyclobutarene layer on a conductive metal layer may be performed in several ways. One technique includes the use of an adhesion promoter, also referred to as coupling agent. The adhesion promoter may be mixed with the cyclobutarene monomer or prepolymer as it is coated on a surface. This technique is carried out following the teaching for depositing a polymeric layer onto a conductive metal layer in the generic method of fabricating a multilayered electrical interconnection device hereinafter described. Another technique includes the provision of a metal tie layer before depositing the polymeric layer. Upon using this technique, a metal tie layer is applied by physical vapor deposition before the polymeric layer is applied using an adhesion promoter.

Adhesion promoters with desirable properties include silane compounds and cyclobutarene compounds. Exemplary silane and cyclobutarene compounds useful as adhesion promoters in the present invention include triethoxyvinyl silane or a BCB of the formula:

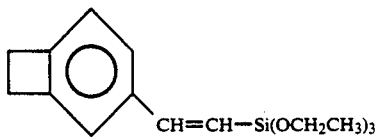

$CH=CH-Si(OCH_2CH_3)_3$

Successive layers of polymer, if desired, may be efficiently adhered to one another by using a solution casting technique. In this technique, the polymer layers are only partially cured until all layers have been applied. Then, by more completely curing the polymer, the contacting layers form chemical bonds between themselves.

One may fabricate multilayered electrical interconnection devices using the following generic method.

An appropriate supporting substrate with an insulating layer is cleaned with an appropriate solvent, followed by exposure to an oxygen-containing plasma. A layer of conductive metal is applied by physical vapor deposition or electroplating, or a cyclobutarene layer is applied by solution casting. This layer is patterned using standard lithographic and wet etching techniques to form a ground/power plane and bond pad areas.

An example of a method for this patterning step is application and definition of a photoresist. The photoresist is exposed and developed. Then, the underlying metal is etched using conventional techniques. The photoresist is removed and an adhesion promoter coated onto substrate. This is followed by applying a BCB prepolymer solution by, for example, spin coating and drying thereof. The BCB prepolymer is then partially cured in nitrogen.

A metallic hard mask is applied onto the polymer surface. The hard mask is defined and etched using standard lithographic and wet etching techniques. The exposed polymer is etched in a plasma etcher. For the DVS-BCB, an oxygen/fluorine gas mixture may be used. The hard mask is removed and the surface is submitted to low energy sputtering.

Since the metallic hard mask is removed by etching, the metal used for the hard mask should not be the same conductive metal used for the conductive metal layer. The use of different conductive metals permits the use of a selective etching acid to prevent the conductive metal layer from being etched off together with the hard mask. A tie layer of carbide-forming metal is then applied by physical vapor deposition, followed by application by physical vapor deposition or electroplating of conductive metal.

Low energy sputtering consists of irradiating a surface with low energy ion/neutral beams to activate the surface by sputtering off the aliphatic hydrogens present on the polymer surface. Preferably, low energy sputtering is conducted at a power density of less than about 2.0 watts/in$^2$ and at an energy density of less than about 200 Joules/in$^2$. This surface is not altered to a depth of more than about 50Å. The ion/neutral beams are generated from noble gas sources. Simultaneously with the ion/neutral beams or after applying the ion/neutral beams, a first metallization source comprising carbide-forming metal vapor is deposited onto the polymer surface. Then, a second metallization beam comprising conductive metal vapors is deposited onto the tie layer.

The low energy sputtering/physical vapor deposition step is then followed by patterning the conductive metal layer using standard lithographic and/or wet etching techniques as set out hereinbefore. This procedure is repeated until the desired structure is completed. The whole multichip module is then exposed to conditions to fully cure the successive polymer layers.

It has been found that the final heat treatment of the electrical interconnection device may cause diffusion of the conductive metal into the tie layer forming alloys or oxides of both metals. However, this diffusion is in such a small amount that it is considered insignificant.

After completion of the electrical interconnection device, a plurality of circuitries may be connected thereon to obtain the multichip module.

More details for constructing a multichip module may be found in "Processing Guide for Multilayer Interconnect Fabrication", The Dow Chemical Company, 1991, and "*Multilayer Interconnection Structures using Second Generation Polymers derived from Bisbenzocyclobutane*", P. H. Townsend et al., 1989.

Upon using the low energy sputtering/physical vapor deposition procedure, the planarization of the cyclobutarene layers is not altered dramatically. For example, the cyclobutarene surfaces are only roughened in less than 50Å, preferably less than 20Å, more preferably less than 10Å, and most preferably not more than 3Å. Accordingly, as the treated cyclobutarene layer retains its continuous and planar configuration, the tie layer can be as thin as 10Å.

The electrical interconnection device of the present invention is useful to construct multichip modules, circuit boards, integrated circuits and solid state electronic devices.

ILLUSTRATIVE EMBODIMENTS

The following examples are given to illustrate the invention and should not be interpreted as limiting it in any way. Unless stated otherwise, all parts and percentages are given by weight.

EXAMPLES 1-7

A benzocyclobutane-divinyl tetramethyl disiloxane (BCB-DVS) film is coated on a silicon wafer with an approximately 1 μm thick oxidized ($SiO_2$) surface. The wafer is cleaned with deionized water on a spin coater at 1,000-2,000 rpm, dried, and then subjected to RF oxygen plasma cleaning for 15 minutes (min). The resulting wafer is treated with 3 cycles of deionized water rinse/dump to remove the oxide particles, which may be present on the surface after the plasma cleaning. The wafer is then put through the spinning rinse/dry procedure as described previously.

The cleaned wafer is spin-coated with 0.5 percent aqueous solution of a coupling agent, vinyl triethoxy silane in acetic acid, at a speed of 5000 rpm. A 55 percent BCB-DVS prepolymer solution in mesitylene is applied to the cleaned wafer surface during spinning, to yield an approximate 5 μm thick film. The coated wafer is then treated at 250° C. for 45 min in $N_2$ atmosphere to crosslink the BCB-DVS prepolymer to its final form. The BCB-DVS wafer is then cut into 1"×1" (2.54 cm×2.54 cm) squares using a diamond scribe. Each of the BCB-DVS samples is cleaned with $CH_3OH$ before it is introduced into a ion beam assisted titanium and copper deposition chamber. The deposition chamber is operated at a background pressure of $5 \times 10^{-7}$ torr and the sputtering conditions are power density of 0.6 Watts/in² and energy density of 1.2-90 Joules/in².

Each polymer surface is bombarded for a different time period with a 1 keV 98 μA/cm² $Ar^+$/Ar beam generated from a Kaufman ion gun. The chamber pressure increases to $1 \times 10^{-4}$ torr when the ion gun is being operated. This treatment is designed to sputter the surface polymeric hydrogens away for generation of the active carbon sites for the subsequent bonding to the tie layer. Immediately after the sputtering, a layer of titanium (Ti), evaporated from an electron gun (E-gun) evaporator, is deposited on the sputtered surface at a rate of 10 Å/sec and then a layer of copper (Cu), evaporated from another E-gun evaporator, is deposited on the Ti surface at a rate of 16 Å/sec.

The adhesion of the copper layer was measured by using a Sebastian Pulling Test, using a Sebastian 5/A Material Tester. The sputtering time period, tie layer and conductive metal layer thicknesses, as well as the adhesion data are given in Table 1 below.

EXAMPLES 8-14

The procedure of Example 1 is repeated using the same materials and conditions, except that the $Ar^+$/Ar beam is on while the tie layer metal and/or conductive metal is vapor deposited.

Each polymer surface is bombarded for a different time period with a 1 keV 98 μA/cm² $Ar^+$/Ar beam generated from a Kaufman ion gun. The chamber pressure increased to $1 \times 10^{-4}$ torr from $5 \times 10^{-7}$ torr when the ion gun was being operated. Immediately after the sputtering, a layer of Ti is vapor deposited on the sputtered surfaces at a rate of 10 Å/sec. During this deposition, the surfaces are also bombarded with a 1 keV $Ar^+$/Ar beam with the atom arrival ratio, R=0.10, where $$R = \frac{\text{no. of } Ar^+/Ar \text{ bombarded on the surface}}{\text{no. of depositing atoms arriving on the surface}}$$

for promotion of he interfacial interactions which may enhance the adhesion. A layer of Cu is then vapor deposited on the Ti surface at a rate of 16 Å/sec and R=0.043.

The sputtering time periods, tie layer and conductive metal layer thicknesses, as well as the adhesion data are given in Table I below.

Comparative Examples A-C

The procedure of Example 1 or 8 is repeated using the same materials and conditions, except that the conductive metal is vapor deposited directly on the BCB surface without using an interface tie layer. The sputtering time period, conductive metal layer thickness as well as the adhesion data are given in Table I below.

TABLE I

| Ex./Comp. Exp. No. | Sputtering Period, (s) | Tie Layer, Thickness (Å) | Conductive Metal Layer, Thickness (μm) | Adhesive Strength[3] (MPa ± σ) |
|---|---|---|---|---|
| 1 | 10 | Ti - 50 | Cu - 1 | 49 ± 5 |
| 2 | 35 | Ti - 50 | Cu - 1 | 31 ± 3 |
| 3 | 75 | Ti - 10 | Cu - 1 | 27 ± 4 |
| 4 | 75 | Ti - 25 | Cu - 1 | 41 ± 12 |
| 5 | 75 | Ti - 50 | Cu - 1 | 42 ± 10 |
| 6 | 150 | Ti[1] - 50 | Cu - 1 | 58 ± 4 |
| 7 | 150 | Ti - 200 | Cu - 1 | 55 ± 4 |
| 8 | 2 | Ti[1] - 10 | Cu[2] - 1 | 24 ± 12 |
| 9 | 2 | Ti[1] - 50 | Cu[2] - 1 | 17 ± 5 |
| 10 | 75 | Ti[1] - 10 | Cu[2] - 1 | 23 ± 10 |
| 11 | 75 | Ti[1] - 50 | Cu[2] - 1 | 22 ± 5 |
| 12 | 150 | Ti[1] - 50 | Cu[2] - 1 | 31 ± 17 |
| 13 | 150 | Ti[1] - 200 | Cu[2] - 1 | 38 ± 12 |
| 14 | 150 | Ti[1] - 200 | Cu[2] - 1 | 25 ± 7 |
| A* | None | None | Cu - 1 | 0.35 ± 0.21 |
| B* | 150 | None | Cu - 1 | 2.1 ± 0.7 |
| C* | 150 | None | Cu[2] - 1 | 1.2 ± 0.6 |

TABLE I-continued

| Ex./Comp. Exp. No. | Sputtering Period, (s) | Tie Layer, Thickness (Å) | Conductive Metal Layer, Thickness ($\mu$m) | Adhesive Strength[3] (MPa ± $\sigma$) |
|---|---|---|---|---|
| D* | None | Ti - 50 | Cu - 1 | 2.8 ± 2.8 |

*Not an example of present invention
[1] Atom arrival ratio R = 0.10
[2] Atom arrival ratio R = 0.043
[3] Sebastian Pulling Test ($\sigma$ is standard deviation)

As readily apparent from Table I, the electrical interconnection device of the present invention presents excellent adhesion of the copper layer to the polymeric dielectric layer. Further, it should be noted that the thin tie layer, i.e. 10 or 50Å Å, can be deposited on the polymer surface since the sputtering treatment of this polymer surface only disrupted the polymer surface to a depth of less than 3Å.

EXAMPLES 15-18

A set of multilayered structures is prepared following the general procedure of Example 1. The composition of each sample, thickness of each layer as well as adhesion data are shown in Table II below.

TABLE II

| Example No. | Structure Composition | Adhesive Strength[3] (MPa ± $\sigma$) |
|---|---|---|
| 15* | Si/BCB/50Å Ti/1 $\mu$m Cu/BCB/50Å Ti/1 $\mu$m Cu | 20 ± 12 |
| 16 | Si/BCB/50Å Ti/1 $\mu$m Cu/BCB/50Å Ti/1 $\mu$m Cu | 21 ± 7 |
| 17* | Si/BCB/10Å Ti/1 $\mu$m Cu/BCB/10Å Ti/1 $\mu$m Cu | 21 ± 8 |
| 18 | Si/BCB/50Å Ti/1 $\mu$m Cu/BCB/50Å Ti/1 $\mu$m Cu | 21 ± 7 |

*Atom arrival ratio R = 0.10 for Ti and 0.043 for Cu

As readily apparent from Table 11, the electrical interconnection device of the present invention presents excellent adhesion of the layers throughout the structure.

Onto this multilayered electrical interconnection device, one may now connect a plurality of electronic circuitries to obtain a finished multichip module. Due to the use of BCB as the dielectric layers and present method of adhering a conductive metal thereto, the finished multichip module is found to present no loss of high frequency response.

What is claimed is:

1. A method of adhering a conductive metal layer onto a dielectric cyclobutarene polymer layer, method which comprises
   a) low energy sputtering the dielectric cyclobutarene polymer surface with a low energy ion/neutral beam to activate the surface by sputtering off the aliphatic hydrogens present on the polymer surface at an energy density such that the polymer surface is roughened to a depth of no more than about 50Å;
   b) depositing a carbide-forming metal interface layer having a thickness between about 5 and about 200Å onto the sputtered polymer surface:
   c) depositing the conductive metal layer onto the carbide-forming metal interface layer, and wherein the multilayered structure is built up on a supporting substrate.

2. The method of claim 1 wherein the sputtering is conducted at a power density of less than about 2.0 watts/in$^2$ and at an energy density of less than about 200 Joules/in$^2$.

3. The method of claim 1 wherein the sputtering is conducted at an energy density such that the cyclobutarene polymer surface is roughened to a depth of no more than about 20Å.

4. The method of claim 1 wherein the carbide forming metal is a transition metal of Group IV-B, V-B, VI-B or VIII.

5. The method of claim 4 wherein the carbide forming metal is titanium, chromium, nickel, tungsten or an alloy thereof.

6. The method of claim 5 wherein the carbide forming metal is titanium.

7. The method of claim 6 wherein the metal interface layer after a final heat treatment comprises titanium, titanium oxides, titanium-copper alloys, titanium-copper oxides or a mixture thereof.

8. The method of claim 8 wherein the conductive metal layer is copper.

9. The method of claim 1 wherein the conductive metal layer is copper, aluminum, silver, gold, magnesium, or platinum.

10. An improved method of making an electrical interconnection device having means to connect electronic circuitries on a supporting substrate with at least two conductive metal layers separated by a dielectric cyclobutarene polymer layer, wherein the improvement comprises
   a) low energy sputtering the dielectric cyclobutarene polymer surface with a low energy ion/neutral beam to activate the surface by sputtering off the aliphatic hydrogens present on the polymer surface at an energy density such that the polymer surface is roughened to a depth of no more than about 50Å;
   b) depositing a carbide-forming metal interface layer having a thickness between about 5 and about 200Å onto the sputtered polymer surface:
   c) depositing the conductive metal layer onto the carbide-forming metal interface layer, and wherein the multilayered structure is built up on a supporting substrate.

11. The method of claim 10 wherein the sputtering is conducted at an energy density such that the cyclobutarene polymer surface is roughened to a depth of no more than about 20Å.

12. The method of claim 10 wherein the carbide forming metal is a transition metal of Group IV-B, V-B, VI-B, or VIII.

13. The method of claim 1 wherein the carbide forming metal is titanium, chromium, nickel, tungsten, or an alloy thereof.

14. The method of claim 13 wherein the carbide forming metal is titanium.

15. The method of claim 10 wherein the conductive metal layer is copper, aluminum, silver, gold, magnesium, or platinum.

16. The method of claim 15 wherein the conductive metal layer is copper.

* * * * *

UNITED STATES PATENT AND TRADEMARK OFFICE
CERTIFICATE OF CORRECTION

PATENT NO. : 5,196,103

DATED : March 23, 1993

INVENTOR(S) : James C. Tou, of Midland, Mich. and Paul H. Townsend, III, of Midland, Mich.

It is certified that error appears in the above-identified patent and that said Letters Patent is hereby corrected as shown below:

Column 12, line 23, delete " claim 8 " and insert -- claim 1 --.

Column 12, line 54, delete " claim 1 " and insert -- claim 12 --.

Signed and Sealed this

Fifteenth Day of February, 1994

Attest:

BRUCE LEHMAN

Attesting Officer        Commissioner of Patents and Trademarks